(12) United States Patent
Nakamura et al.

(10) Patent No.: US 8,480,806 B2
(45) Date of Patent: Jul. 9, 2013

(54) BONDING STRUCTURE AND SEMICONDUCTOR DEVICE MANUFACTURING APPARATUS

(75) Inventors: Taichi Nakamura, Nagoya (JP); Hiroshi Takebayashi, Nagoya (JP); Tomoyuki Fujii, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1125 days.

(21) Appl. No.: 12/349,693

(22) Filed: Jan. 7, 2009

(65) Prior Publication Data
US 2009/0173449 A1 Jul. 9, 2009

(30) Foreign Application Priority Data

Jan. 8, 2008 (JP) .................................. 2008-001421
Jan. 6, 2009 (JP) .................................. 2009-001194

(51) Int. Cl.
*B32B 37/00* (2006.01)
*C23C 16/00* (2006.01)
*B23B 31/28* (2006.01)

(52) U.S. Cl.
USPC ....... 118/728; 156/345.51; 279/128; 361/234

(58) Field of Classification Search
USPC ....... 118/728; 156/345.51; 279/128; 361/234
See application file for complete search history.

(56) References Cited

U.S. PATENT DOCUMENTS 5,995,357 A 11/1999 Ushikoshi et al.
6,617,514 B1 * 9/2003 Ushikoshi et al. .......... 174/84 R

FOREIGN PATENT DOCUMENTS

JP 3790000 B2 4/2006

* cited by examiner

*Primary Examiner* — Parviz Hassanzadeh
*Assistant Examiner* — Nathan K Ford
(74) *Attorney, Agent, or Firm* — Burr & Brown

(57) ABSTRACT

A bonding structure according to the present invention includes: a ceramic member including a hole; a terminal embedded in the ceramic member and including an exposed surface exposed to a bottom portion of the hole; a brazed bond layer formed in contact with the exposed surface of the terminal; and a connecting member inserted in the hole, and bonded to the terminal via the brazed bond layer. An inner diameter of the hole is larger than an outer diameter of the connecting member. A clearance is formed between the hole and the connecting member when the connecting member is inserted in the hole. A braze pool space is formed in a surface of the hole and has a substantially semicircular shape in a cross-sectional plane. The braze pool space is partially filled with a braze material.

7 Claims, 10 Drawing Sheets

BONDING STRUCTURE AND SEMICONDUCTOR DEVICE MANUFACTURING APPARATUS

CROSS REFERENCE TO RELATED APPLICATION

This application is based upon and claims the benefit of priority from prior Japanese Patent Application No. 2008-001421, filed on Jan. 8, 2008, and Japanese Patent Application No. 2009-001194, filed on Jan. 6, 2009; the entire contents of which are incorporated herein by reference.

BACKGROUND OF THE INVENTION

1. Field of the Invention

The present invention relates to bonding structures and semiconductor device manufacturing apparatuses. More specifically, the present invention relates to a bonding structure for bonding a connecting member to a metal terminal embedded in a ceramic member, a bonding structure including a connecting member for supplying an electric power to an electrode embedded in a ceramic member, and a semiconductor device manufacturing apparatus having this bonding structure.

2. Description of the Related Art

Semiconductor wafer susceptors such as an electrostatic chuck in which an electrode is embedded in a ceramic member are used in the field of semiconductor device manufacturing apparatuses such as an etching apparatus, a CVD apparatus or the like. Examples of the semiconductor wafer susceptors include: a semiconductor wafer susceptor in which an electrode is embedded in a base material such as aluminum nitride or dense alumina, and is configured to function as a discharge electrode for generating plasma; a semiconductor wafer susceptor which includes metal resistors (heater) embedded in a base material such as aluminum nitride or alumina, and is configured to function as a ceramic heater for controlling the temperature of a wafer in a heat treatment processing such as CVD, or the like. In addition, some semiconductor wafer susceptors include electrodes embedded in the base materials and function as electrostatic chucks configured to chuck and hold semiconductor wafers in the process of wafer transfer, an exposure, a film forming such as CVD and sputtering, a micro-processing, a cleansing, an etching, a dicing, and the like.

For the purpose of supplying these semiconductor device manufacturing apparatuses with the electric power, for example, the semiconductor wafer susceptor has a bonding structure which includes a connecting member that supplies an electric power to the terminal embedded in the ceramic member from the outside of the semiconductor susceptors. (see Japanese Publication Patent No. 3790000, for example). Some semiconductor wafer susceptors are supplied with the electric power from the outside through an electrode embedded in the connecting member. Such electrode has a spiral groove on its surface and supplies the electric power to the semiconductor wafer susceptors from the outside, by screwing the end of the electrode into the spiral grove that is formed inside the connecting member and that is corresponding to the electrode.

However, the bonding structure tends to break due to a stress produced when the end of the electrode is screwed into the groove, or due to a stress that is applied to the bonding structure while the semiconductor is used. Accordingly, an improvement on a torsional breaking strength of the bonding structure has been awaited.

SUMMARY OF THE INVENTION

A first aspect of the present invention is summarized as a bonding structure including: a ceramic member including a hole; a terminal embedded in the ceramic member, including an exposed surface exposed to a bottom portion of the hole, and made of a refractory metal having a thermal expansion coefficient substantially equal to a thermal expansion coefficient of the ceramic member; a brazed bond layer formed in contact with the exposed surface of the terminal; and a connecting member inserted in the hole, bonded to the terminal via the brazed bond layer, and made of a refractory metal having a thermal expansion coefficient substantially equal to the thermal expansion coefficient of the ceramic member. An inner diameter of the hole is larger than an outer diameter of the connecting member. A clearance is formed between the hole and the connecting member when the connecting member is inserted in the hole. A braze pool space is formed in a part of a surface of the hole. The braze pool space has a substantially semicircular shape in a cross-sectional plane parallel with a main surface of the ceramic member. The braze pool space is partially filled with a braze material.

DETAILED DESCRIPTION OF THE INVENTION

Figure 1A:
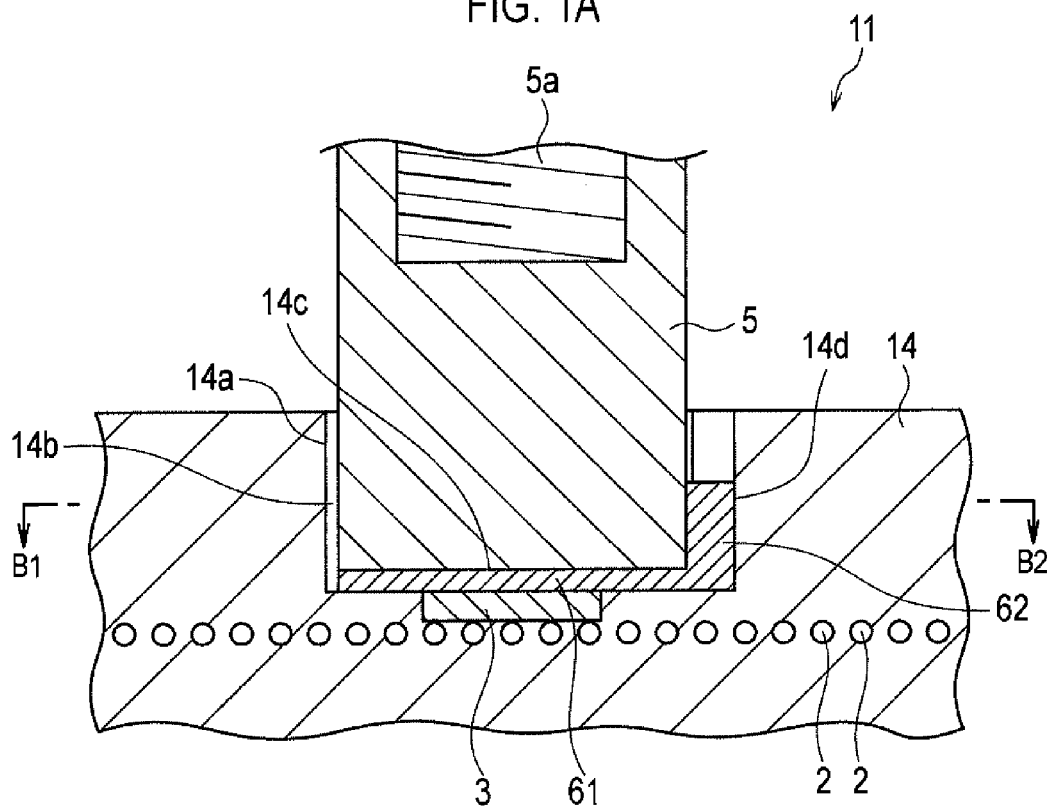
FIG. 1A is a schematic, cross-sectional view of a semiconductor wafer susceptor according to an embodiment, which is vertical to the main surface of the ceramic member included in the semiconductor wafer susceptor.

Descriptions will be provided hereinafter for the present invention by citing an embodiment. Note that the present invention is not limited to the following embodiment. Throughout the drawings, components having the same or similar functions will be denoted by the same or similar reference numerals, and duplicated descriptions for the same or similar components will be omitted.

EMBODIMENT

Semiconductor Wafer Susceptor (Bonding Structure)

Figure 1B:
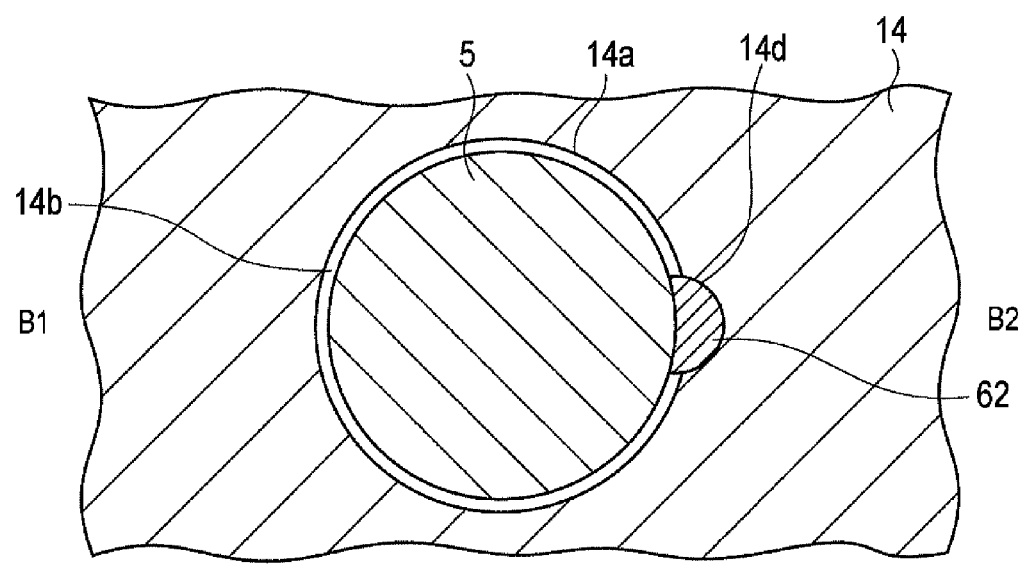
FIG. 1B is a schematic, cross-sectional view of the semiconductor wafer susceptor according to the embodiment, which is parallel with the main surface of the ceramic member.

FIG. 1A is a schematic, cross-sectional view of a semiconductor wafer susceptor according to the embodiment, which is vertical to the main surface of the ceramic member included in the semiconductor wafer susceptor. FIG. 1B is a schematic, cross-sectional view of the semiconductor wafer susceptor according to the embodiment, which is parallel with the main surface of the ceramic member. Note that the descriptions for a semiconductor wafer susceptor 11 according to the embodiment constitute descriptions for a bonding structure and a semiconductor device manufacturing apparatus including the bonding structure.

The semiconductor wafer susceptor 11 according to the embodiment includes: a ceramic member 14, a terminal 3, a brazed bond layer 61 and a connecting member 5. As a conductive layer, heater resistors 2 are embedded inside the ceramic member 14. A hole 14a is formed in an upper portion of the ceramic member 14. A first main surface of the terminal 3 is exposed to the bottom portion of the hole 14a. A second main surface of the terminal 3 electrically contacts the heater resistors 2. The terminal 3 is made of a refractory metal whose thermal expansion coefficient is substantially equal to that of the ceramic member 14. The brazed bond layer 61 includes a gold (Au) layer, and is in contact with the first main surface of the terminal 3. The connecting member 5 is inserted in the hole 14a, and is thus bonded to the terminal 3 via the brazed bond layer 61 being interposed in between. The connecting member 5 is made of a refractory metal having a thermal expansion coefficient substantially equal to a thermal expansion coefficient of the ceramic member 14. The heater resistors 2 configure conductive layers and are embedded in the ceramic member 14 in parallel with the main surface of the ceramic member 14. The inner diameter of the hole 14a is larger than the outer diameter of the connecting member 5. A clearance 14b is formed between the surface of the hole 14a and the outer surface of the connecting member 5. Accordingly, the connecting member 5 can be inserted in the hole 14a. Further, the connecting member 5 inserted in the hole 14a can thermally expand. The clearance 14b may be formed on the whole circumferential surface of the connecting member 5. Alternatively, a part of the surface of the connecting member 5 may be in contact with the surface of the hole 14b. Actually, the clearance 14b is formed in at least any part around the connecting member 5.

Figure 4A:
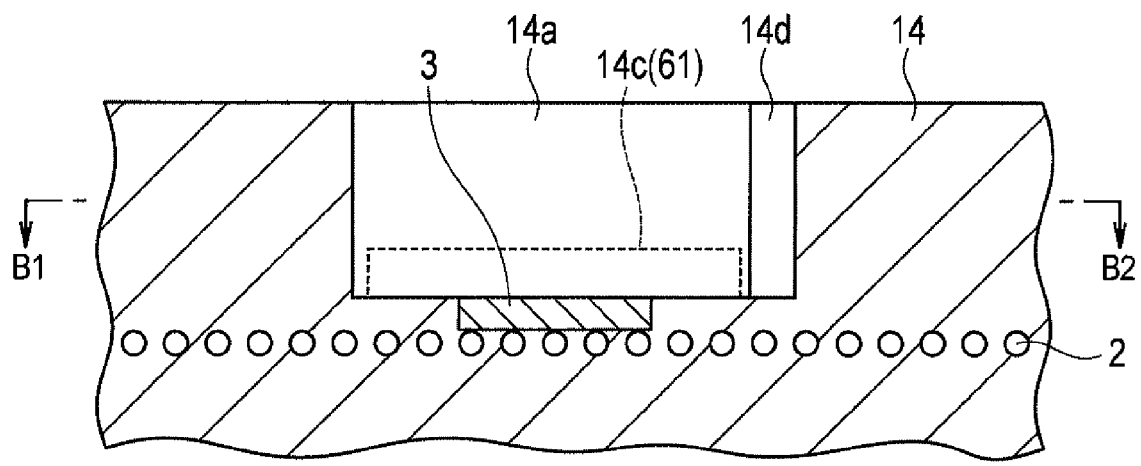
FIGS. 4A and 4B show processes of manufacturing the semiconductor wafer susceptor according to the embodiment.
Figure 6:
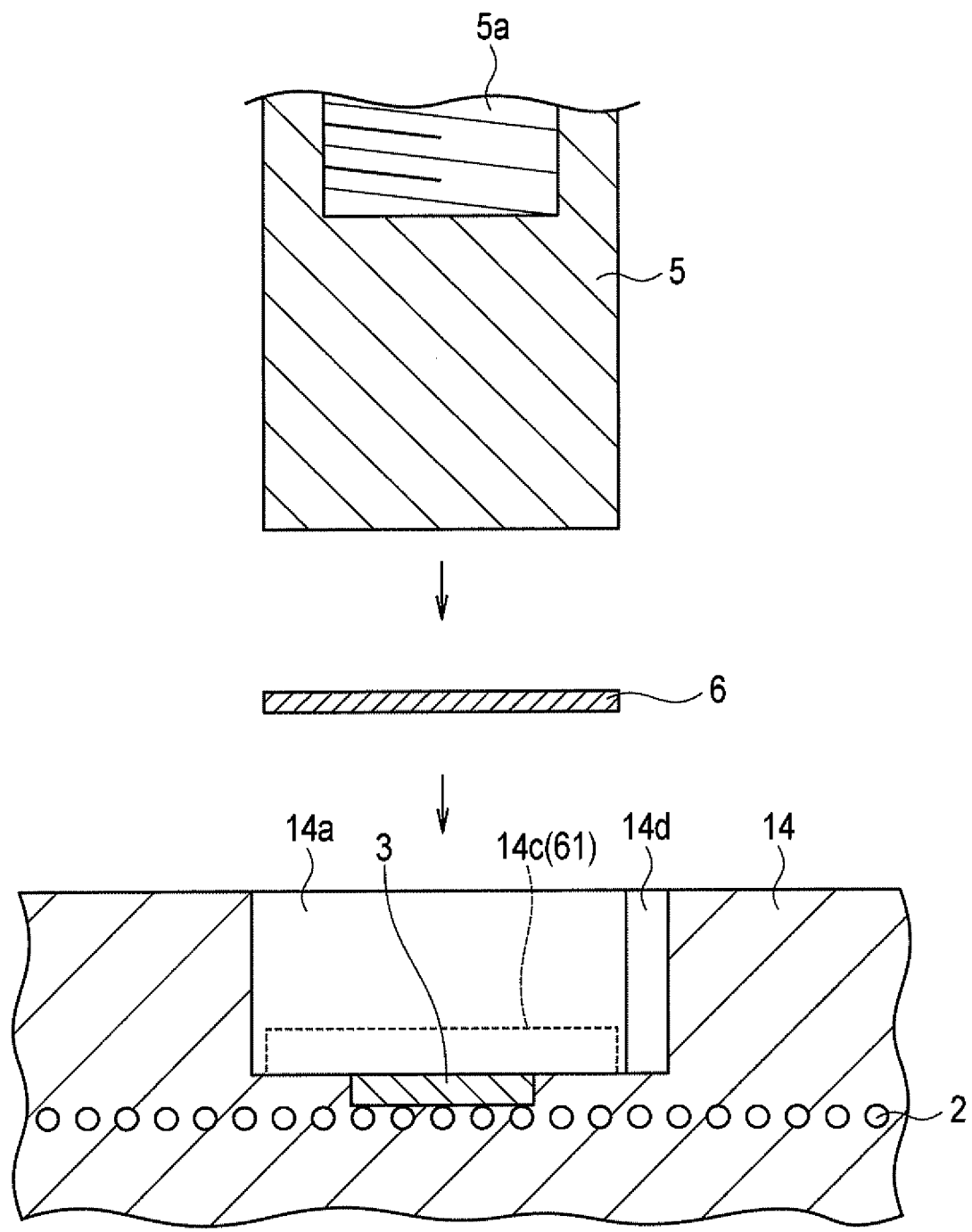
FIG. 6 shows a process of manufacturing the semiconductor wafer susceptor according to the embodiment.

As shown in FIGS. 1A, 4A and 6, a first space 14c is formed between the main surface of the end portion of the connecting member 5 and the bottom surface of the hole 14a including the first main surface (exposed surface) of the terminal 3. A braze material 62 constituting the brazed bond layer 61 partially fills the first space 14c. Here, the first space 14c has a substantially column shape that includes, as a main (bottom) surface, the main surface of the end portion of the connecting member. A braze pool space 14d is formed in a part of the surface of the hole 14a in the ceramic member 14, and is partially filled with the braze material 62 constituting a part of the brazed bond layer 61. The braze pool space 14d has a substantially semicircular shape in a cross-sectional plane parallel with the main surface of the ceramic member 14.

A spiral groove 5a is formed inside the connecting member 5. An end of the electrode having a corresponding spiral groove is screwed into the groove 5a, although the illustration of the electrode is omitted for easy understanding of the present invention. In this respect, the electrode is provided for supplying the electric power to the susceptor 11.

As for the clearance 14b, it is preferable that the clearance 14b should be wider than 0 mm, and approximately 0.5 mm, when the outer diameter of the connecting member 5 is set at 4 mm to 6 mm. When the clearance 14b is narrower than the lower limit, the connecting member 5 cannot be inserted in the hole 14a, and thereby making the processes of producing the susceptor 11 difficult. On the contrary, when the diameter of the hole 14a is too large, impurities tend to enter the clearance 14b, and thereby causing a contamination or electrode corrosion. A hole 14a larger than necessary need not be formed in the ceramic member, since the strength of the ceramic member 14 decreases as the hole 14a formed in the ceramic member 14 becomes larger in size. In addition, the clearance 14b is expected to play a function of guiding the insertion of the connecting member 5 into the hole 14a.

The material for the ceramic member 14 is not specifically limited. Examples of the material for the ceramic member 14 include alumina, aluminum nitride (AlN), trisilicon tetranitride ($Si_3N_4$) and boron nitride (BN). These compounds can be formed into a desired shape by sintering or the like.

With regard to the material for the terminal 3, it is preferable that the terminal 3 should be formed of a refractory metal having a thermal expansion coefficient substantially equal to the thermal expansion coefficient of the ceramic member 14. This is because the material for the terminal 3 is sintered together with a ceramic powder such as alumina powder or aluminum nitride powder, which is the material for the ceramic member 14, when the ceramic member 14 is manufactured. It is desirable to use a combination of alumina with any one of niobium and titanium, a combination of aluminum nitride with any one of molybdenum and platinum, or a combination of a combination of $Si_3N_4$ or boron nitride (BN) and tungsten. Although the material for the terminal 3 is not limited to these combinations, use of the combination of aluminum nitride with molybdenum is particularly desirable. When aluminum nitride ceramics is used as the material for the ceramic member 14, molybdenum is preferably used. This is because the molybdenum has a thermal expansion coefficient substantially equal to the thermal expansion coefficient of the aluminum nitride ceramics, and molybdenum can be used as a bulk body which is capable of being embedded in the ceramic member 14, but which is large to a certain extent, when the aluminum nitride ceramics is sintered at a high melting point.

With regard to the material for the connecting member 5, it is preferable that the connecting member should be formed of a metal having a thermal expansion coefficient equal to the thermal expansion coefficient of the material for the terminal 3. This is because, while the connecting member 5 and the ceramic member 14 are directly brazed to each other, a difference in the thermal expansion of the materials tends to decrease the bonding strength between the connecting member 5 and the terminal 3.

When the same material is used for both the connecting member 5 and the terminal 3, the difference in the stress is eliminated between the connecting member 5 and the terminal 3, and therefore the stress applied to the ceramic member 14 can be moderated. From these viewpoints, it is particularly desirable to use molybdenum as the materials respectively for the connecting member 5 and the terminal 3 when the ceramic member 14 is formed of aluminum nitride. Aluminum nitride is an insulating material that is highly heat-conductive and has a high strength. For this reason, aluminum nitride is the most suitable material to be used for the semiconductor wafer susceptor 11.

The diameter of the brazed bond layer 6 should preferably be set substantially equal to the diameter of the connecting member 5. With regard to the thickness of the brazed bond layer 6, the thickness of a gold (Au) layer should preferably be set at not less than 0.1 mm but not more than 0.2 mm, when the diameter of the brazed bond layer 6 is set at not less than 4 mm but not more than 6 mm. This is because, when the thickness of the gold (Au) layer is not included in the foregoing range, the bonding strength decreases.

The materials for the heater resistors 2 are not specifically limited. However, a sheet-shaped metal bulk material should preferably be used. An example of the sheet-shaped metal bulk material is a metal formed into a single sheet. Other examples of the sheet-shaped metal bulk material include a bulk material made of a plate-shaped body having many pores (a perforated metal), and a bulk material made of a mesh-shaped body.

The material for the brazed bond layer 6 is not specifically limited. However, it is desirable to use a braze material containing gold only. This is because intermetallic compound is not produced between the connecting member 5 and the terminal 3 when the brazed bond layer 6 does not contain nickel (Ni), and thereby the semiconductor wafer susceptor 11 can enhance the durability against external forces generated by heat cycles, handlings and the like. In addition, when the brazed bond layer 6 is made of gold only, not a vulnerable intermetallic compound but a solid solution layer is formed as the brazed bond layer 6. Accordingly, this solid solution layer functions as a buffer layer when the external forces are applied to the semiconductor wafer susceptor 11.

Instead of the braze material made of gold only, other various braze materials may be used for the brazed bond layer 6.

The brazed bond layer 6 may be configured of three layers including a first tantalum layer in contact with the first main surface of the terminal 3, a gold layer formed on the first tantalum layer, and a second tantalum layer formed on the gold layer. When the brazed bond layer 6 has the structure having the first and second tantalum layers having the gold layer interposed therebetween, the first tantalum layer and the second tantalum layer are not required to be different, and the purities of these two tantalum layers are substantially equal to each other. Furthermore, the diameter of the brazed bond layer 6 should preferably be set substantially equal to the diameter of the connecting member 5. With regard to the thickness of the brazed bond layer 6, the thickness of the gold (Au) layer should preferably be set at more than 0.05 mm but less than 0.3 mm, when the diameter of the brazed bond layer 6 is set at not less than 4 mm but not more than 6 mm, and concurrently when the thicknesses respectively of the first and second tantalum layers are set at 0.001 mm. This is because, when the thickness of the gold (Au) layer is not included in the foregoing range, the bonding strength decreases. In addition, when the diameter of the brazed bond layer 6 is set at not less than 4 mm but not more than 6 mm, and concurrently when the thickness of the gold (Au) layer is set at 0.15 mm, the thicknesses respectively of the first and second tantalum layers should preferably be set at not less than 0.001 mm but less than 0.07 mm. This is because, when the thicknesses of the first and second tantalum layers respectively are not including in the foregoing range, their bonding strengths decrease.

Figure 10A:
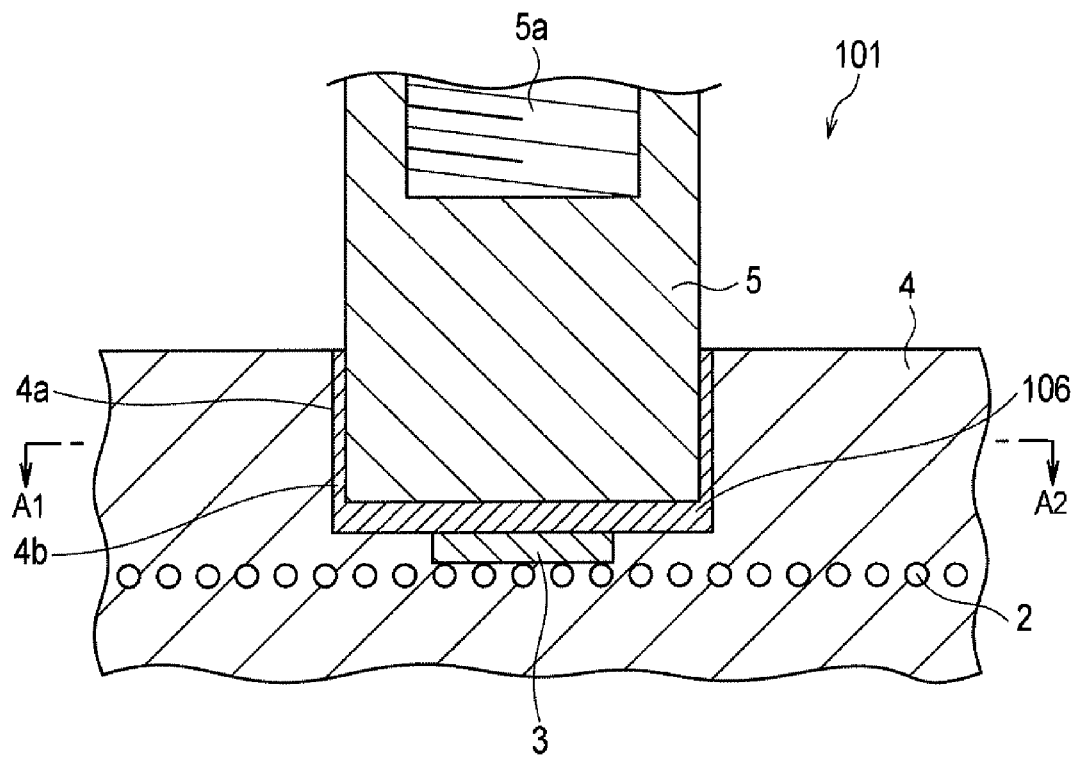
FIG. 10A is a schematic, cross-sectional view of a semiconductor wafer susceptor not including a clearance, which is vertical to the main surface of the ceramic member included in the semiconductor wafer susceptor.
Figure 10B:
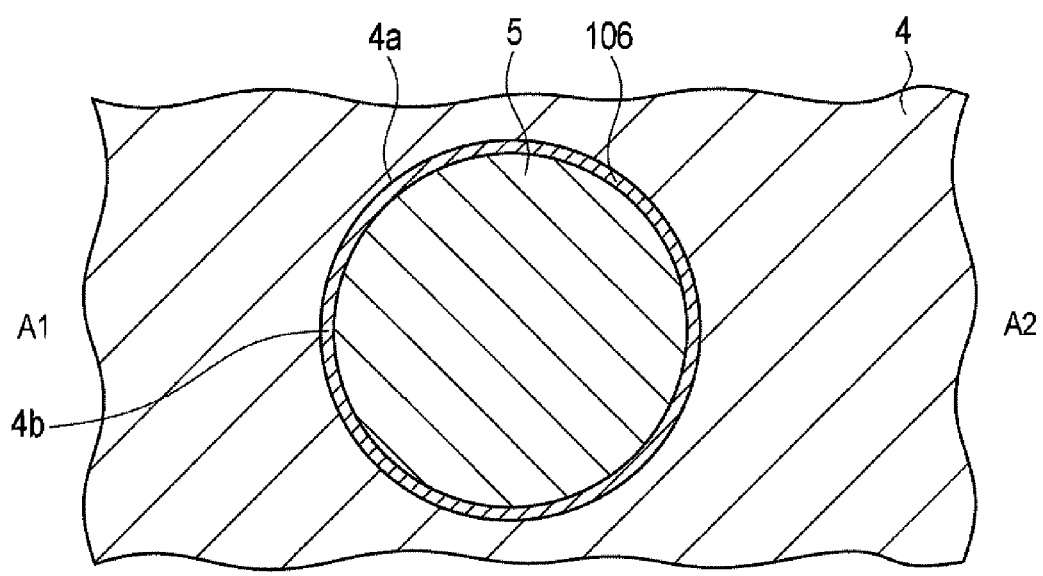
FIG. 10B is a schematic, cross-sectional view of the semiconductor wafer susceptor not including a clearance, which is parallel with the main surface of the ceramic member included in the semiconductor wafer susceptor having no clearance.
Figure 11A:
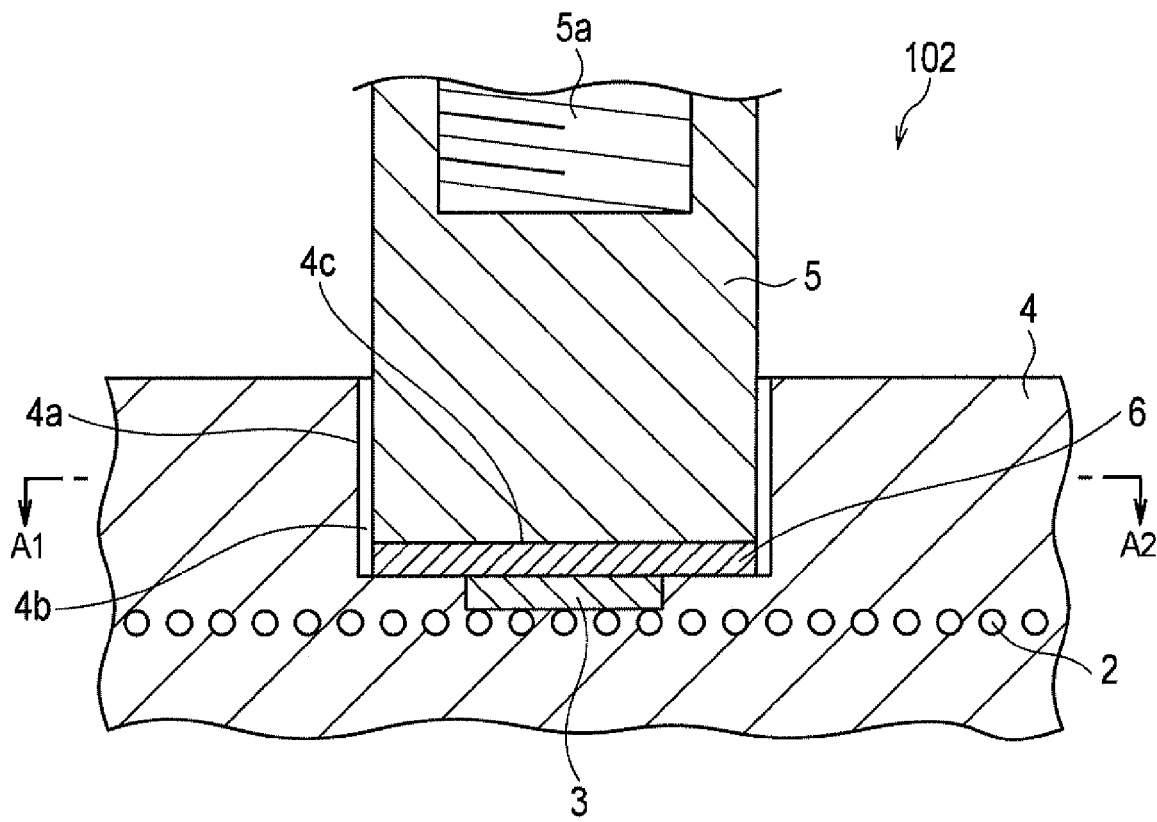
FIG. 11A is a schematic, cross-sectional view of a semiconductor wafer susceptor having a clearance, which is vertical to the main surface of the ceramic member included in the semiconductor wafer susceptor.
Figure 11B:
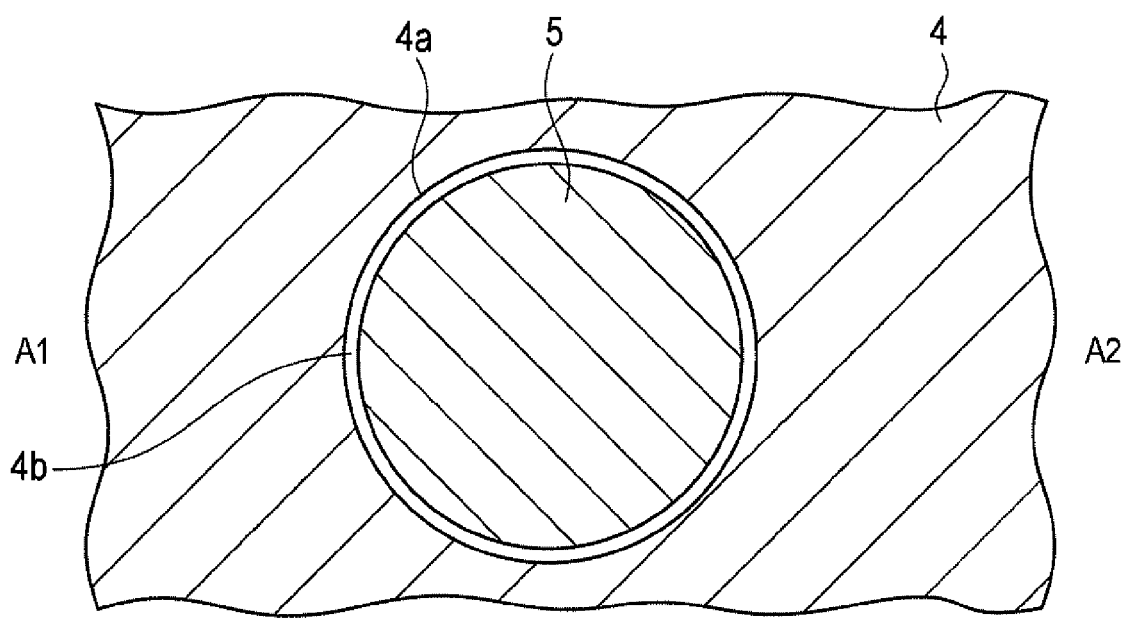
FIG. 11B is a schematic, cross-sectional view of the semiconductor wafer susceptor having the clearance, which is parallel with the main surface of the ceramic.

As a comparative example, a bonding structure or conventional type is shown in FIGS. 10A and 10B. This comparative example represents a semiconductor wafer susceptor 101 that does not include a clearance between the connecting member 5 and a hole 4a in a ceramic member 4. The hole 4a in the ceramic member 4 is filled with the braze material constituting the brazed bond layer 106, except for a space occupied by the connecting member 5. In the semiconductor wafer susceptor 101, the connecting member 5 is fixedly attached to the ceramic member 4 while not including a clearance interposed in between. Accordingly, the heat cycles in the manufacturing or use of the semiconductor wafer susceptor 101 causes the stress between the connecting member 5 and the ceramic member 4, since the thermal expansion coefficients are different between the connecting member 5 and the ceramic member 4. As a result, the ceramic member 4 surrounding the connecting member 5 tends to break.

On the other hand, according to the embodiment, the semiconductor wafer susceptor 11 includes the clearance 14b. Even when the connecting member 5 thermally expands, the clearance 14b hardly causes the thermal stress. Consequently, the ceramic member 14 does not break. Moreover, according to the embodiment, the semiconductor wafer susceptor includes the braze pool space 14d in a part of the clearance 14b. Thus, the braze material 62 and the braze pool space 14d plays a function as a lock (hereinafter referred to as a "locking effect"). For this reason, when compared with any other semiconductor wafer susceptor not including braze pool space 14d, the semiconductor wafer susceptor according to the embodiment has a far higher torsional breaking strength against a torsion force to the ceramic member 14 surrounding the connecting member 5, the torsion force applied around the axis of the connecting member 5.

In the embodiment, only the part of the clearance 14b is filled with the braze material 62. Accordingly, the connecting member 5 and the ceramic member 14 are fixedly attached to each other only in the part of the surface of the hole 14a, while the clearance 14b is formed in most part of the space between the connecting member 5 and the ceramic member 14. Consequently, the ceramic member 14 according to the embodiment does not break unlike the ceramic member 4 as shown in FIGS. 10A and 10B, in which all of the clearance 4b are filled with the braze material 62.

In other words, the semiconductor wafer susceptor 11 according to the embodiment has a far higher torsional breaking strength than the semiconductor wafer susceptor 101 as shown in FIGS. 10A and 10B in which the connecting member 5 having the same cross-sectional shape as the hole 4a is inserted in the hole 4a. Although the connecting member 5 has the same cross-sectional shape as the hole 4a in FIGS. 10A and 10B, the clearance 4b is still produced when the connecting member 5 has a shape including a protruded portion in a part of the connecting member 5. Some of the conventional connecting members 5 are formed while contacting with a part of the surface of the hole 4a. However, the clearance 4b always exists somewhere between the surface of the hole 4a and the connecting member 5 depending on which direction the connecting member 5 may be twisted. Accordingly, when the connecting member 5 is twisted in a reverse direction, the ceramic member 4 tends to break. On the contrary, in the embodiment, the braze material 62 is filled in the braze pool space 14 having a substantially semicircular shape, so that the clearance 14b is not formed in the braze pool space 14d even when a screw attached to the groove 5a formed in the connecting member 5 is tightened or loosed in both directions of twisting the connecting member 5. Thus, the braze material 62 exerts the higher torsional breaking strength as its locking effect.

The braze pool space 14d may be formed singularly in a location of the surface of the hole 4a, or multiple braze pool spaces 14d may be formed respectively in multiple locations thereof. This is because, when paired two or four braze pool spaces 14d are located symmetrically to each other, for example, the torsional breaking strength of the multiple braze pool spaces 14d becomes higher. However, it is undesirable to provide five or more braze pool spaces 14d in the respective locations of the surface of the hole 4a. This is because the larger number of braze pool spaces 14d require larger amount of braze material, and increase probability of breakage in the ceramics. Above all, it is desirable that one or two pairs of braze pool spaces 14d should be formed in the respective mutually-opposed locations in the surface of the hole 14a. It is most desirable that one pair of braze pool spaces 14d should be formed in the respective mutually-opposed locations on the surface of the hole 14a.

As describer above, the embodiment can provide a bonding structure that is reliable even when an external screw is fitted into and removed from the connecting member 5, and that is reliably capable of being used even at a high temperature, and a semiconductor device manufacturing apparatus having this structure.

(Method of Manufacturing Semiconductor Wafer Susceptor (Bonding Structure))

Figure 2:
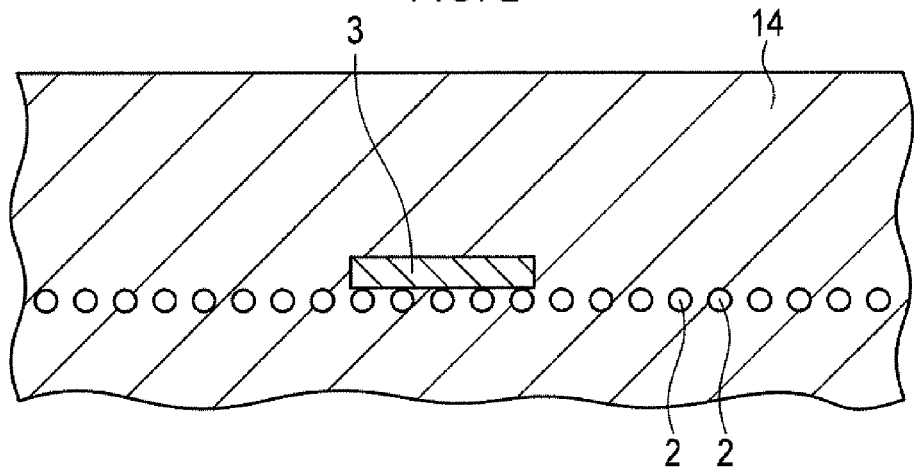
FIG. 2 shows a process of manufacturing the semiconductor wafer susceptor according to the embodiment.

(1) As shown in FIG. 2, the ceramic member 14 is prepared in which the heater resistors 2 are embedded in parallel with the main surface of the ceramic member 14, and in which the terminal 3 is embedded so that the terminal 3 electrically contacts the heater resistors 2.

Figure 3A:
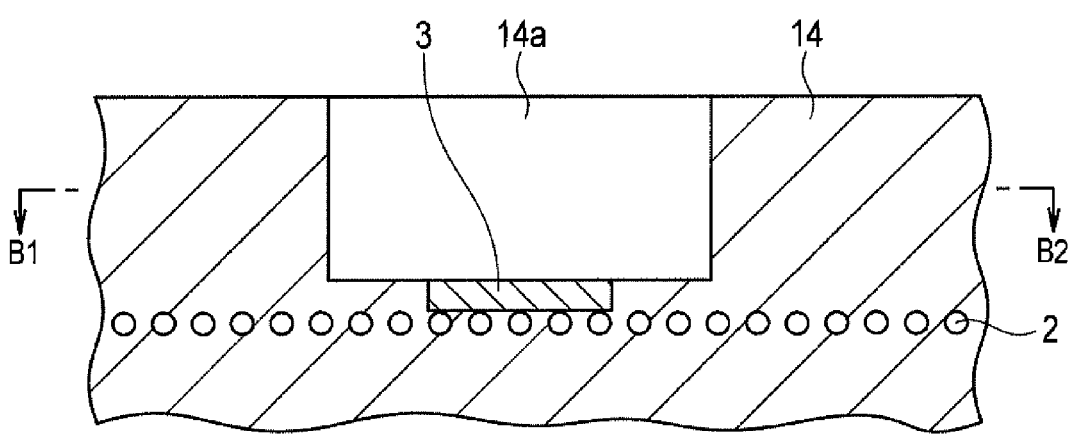
FIGS. 3A and 3B show processes of manufacturing the semiconductor wafer susceptor according to the embodiment.
Figure 3B:
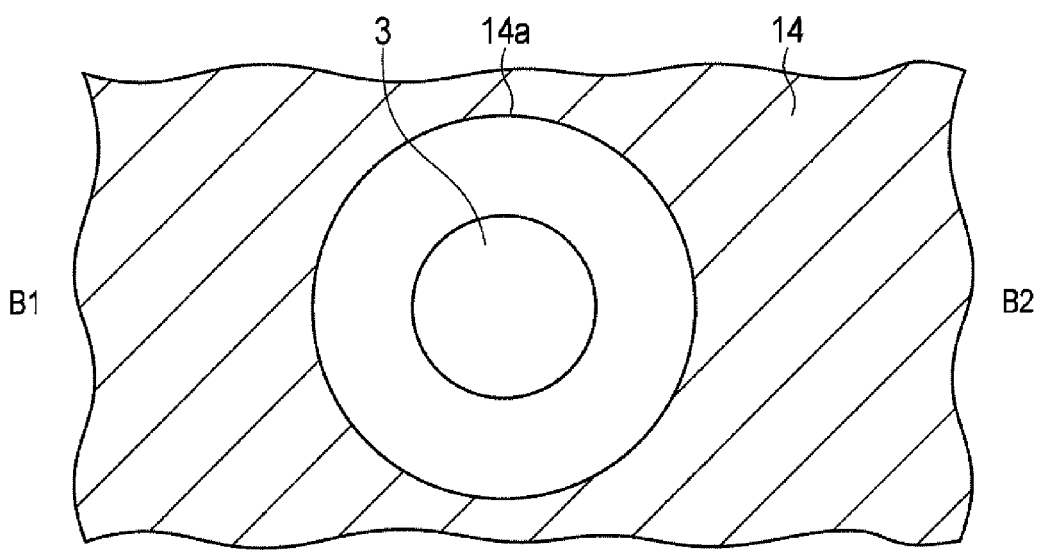

(2) As shown in FIGS. 3A and 3B, the hole 14a whose inner diameter is larger than the outer diameter of the connecting member 5 is formed in the ceramic member 14, in a way that the clearance 14b can be formed between the surface of the hole 14a and the circumference of the connecting member 5, so as to allow the connecting member 5 to thermally expand while inserted in the hole 14a. Note that the first space 14c (61) indicated with an imaginary line in FIG. 3A is to be filled with the brazed material constituting the brazed bond layer 61.

Figure 4B:
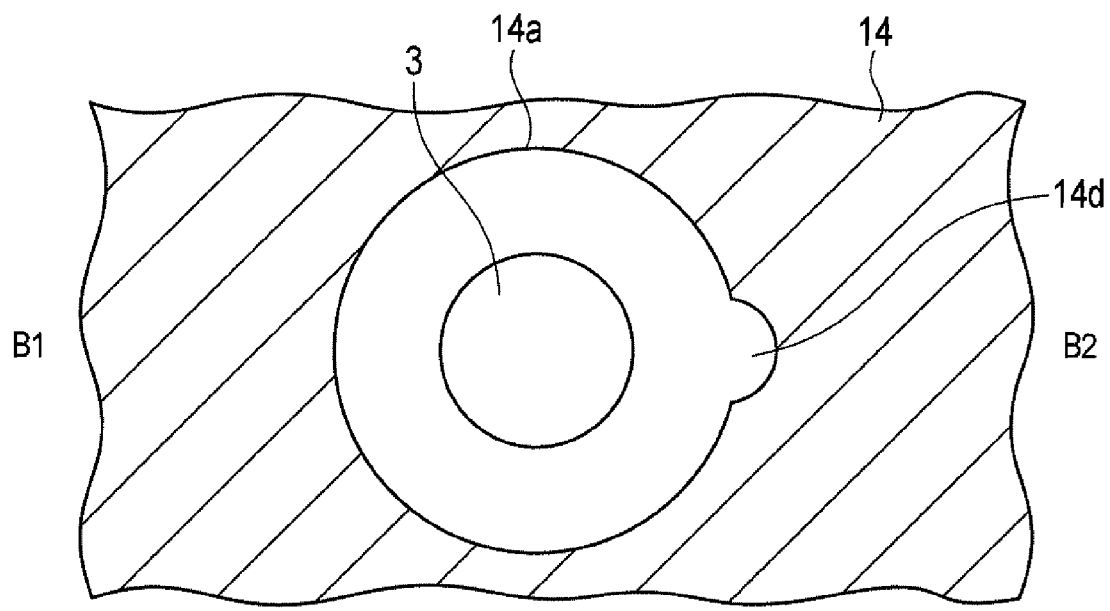

(3) As shown in FIGS. 4A and 4B, by use of a drill or the like, the braze pool space 14d is formed in a part of the outer circumference of the hole 14a in the ceramic member 14. In this respect, the braze pool space 14d may be formed at the same time as the hole 14a is formed.

Figure 5A:
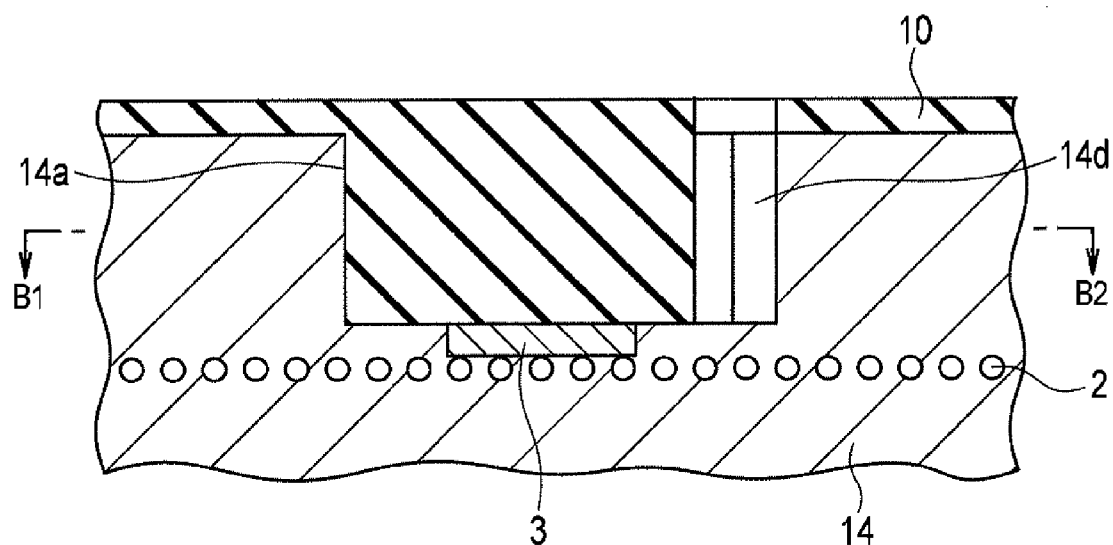
FIGS. 5A and 5B show processes of manufacturing the semiconductor wafer susceptor according to the embodiment.
Figure 5B:
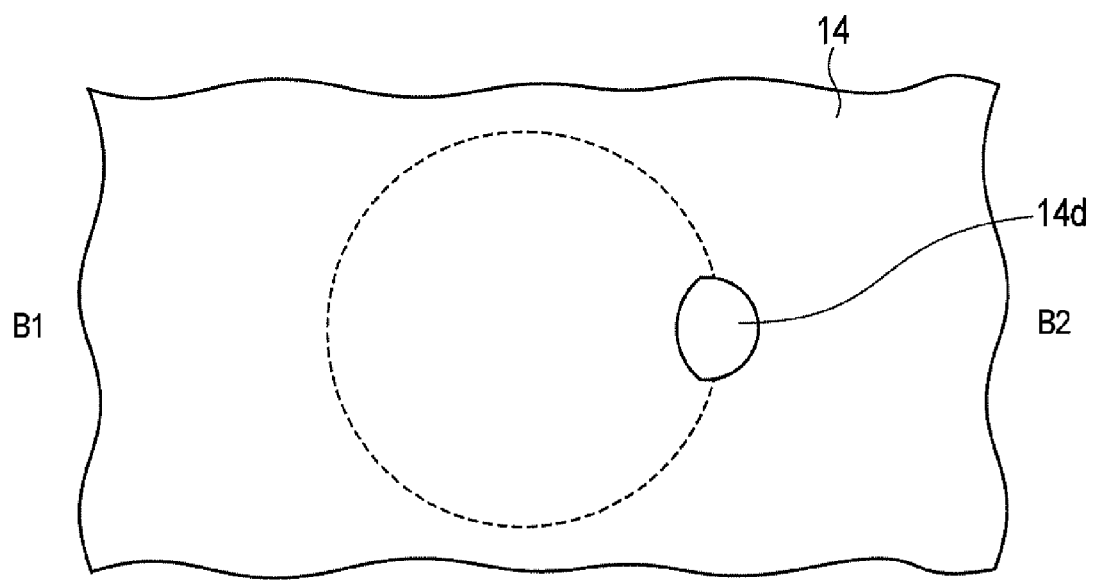

(4) As shown in FIGS. 5A and 5B, a sealing member 10 is arranged on the ceramic member 14 excluding on the braze pool space 14d. Thereafter, a metallizing treatment is applied to the ceramic member 14. It is preferable that the metallizing treatment should be also applied to the connecting member 5, excluding a part to be filled with the braze material constituting the brazed bond layer 6. The metallizing treatment makes it easier for the melted braze material to fill in the braze pool space 14d. However, the metallizing treatment is not necessarily required. The surface of the connecting member 5 is preferably subjected to an oxidation treatment, except for a part of the surface to be filled with the braze material. The surface oxidation treatment prevents the braze material from being applied on the surface of the connecting member 5, so that the entire clearance is prevented from being filled with the braze material. Instead of the oxidation treatment, a material with a poor wettability may be applied to the surface of the connecting member 5. With at least one of the metallizing treatment on the ceramic member 14 and the oxidation treatment on the surface of the connecting member 5, the braze material can be filled only in the braze pool space 14d.

(5) As shown in FIG. 6, the brazed bond layer 6 is arranged in the first space 14c that is formed on the main surface (exposed surface) of the terminal 3. Subsequently, the connecting member 5 is arranged inside the hole 14a in the ceramic member 14 via the brazed bond layer 6 between the base of the hole 14a and the connecting member 5. Thereafter, the first space 14c, which is defined between the connecting member 5 and the base of the hole 14a including the first main surface of the terminal 3, is filled with the braze material constituting the brazed bond layer 6. Afterward, the brazed bond layer 6 thus formed is heated and thus melted. With regard to the heating temperature, it is desirable that the brazed bond layer 6 should be heated up to a temperature approximately 20° C. higher than the melting point of gold. The brazed bond layer 6 is left heated at the temperature for approximately 5 minutes after making sure that the braze material constituting the brazed bond layer 6 is melted.

(6) While the brazed bond layer 6 is left heated at the temperature, as shown in FIG. 1, the braze material is selectively applied on the side surface of the connecting member 5 and the surface of the braze pool space 14d. Thereby, the braze pool space 14d is filled with the braze material Subsequently, the heating process is terminated, and the braze material is left to be cooled down naturally. Thereby, the connecting member 5 is bonded to the terminal 3 with the brazed bond layer 6 interposed therebetween.

Through the foregoing steps, the semiconductor wafer susceptor 11 shown in FIGS. 1A and 1B is manufactured.

MODIFIED EXAMPLES OF THE EMBODIMENTS

Although the foregoing descriptions have been provided for the present invention by citing its embodiment, descriptions and drawings constituting part of this disclosure shall not be construed as imposing limitations on the present invention. From this disclosure, various alternative embodiments, examples and operating techniques will be clear to those skilled in this art. Specifically, the semiconductor wafer susceptor and the bonding structure may have any one of the following configurations.

First Modified Example

Figure 7A:
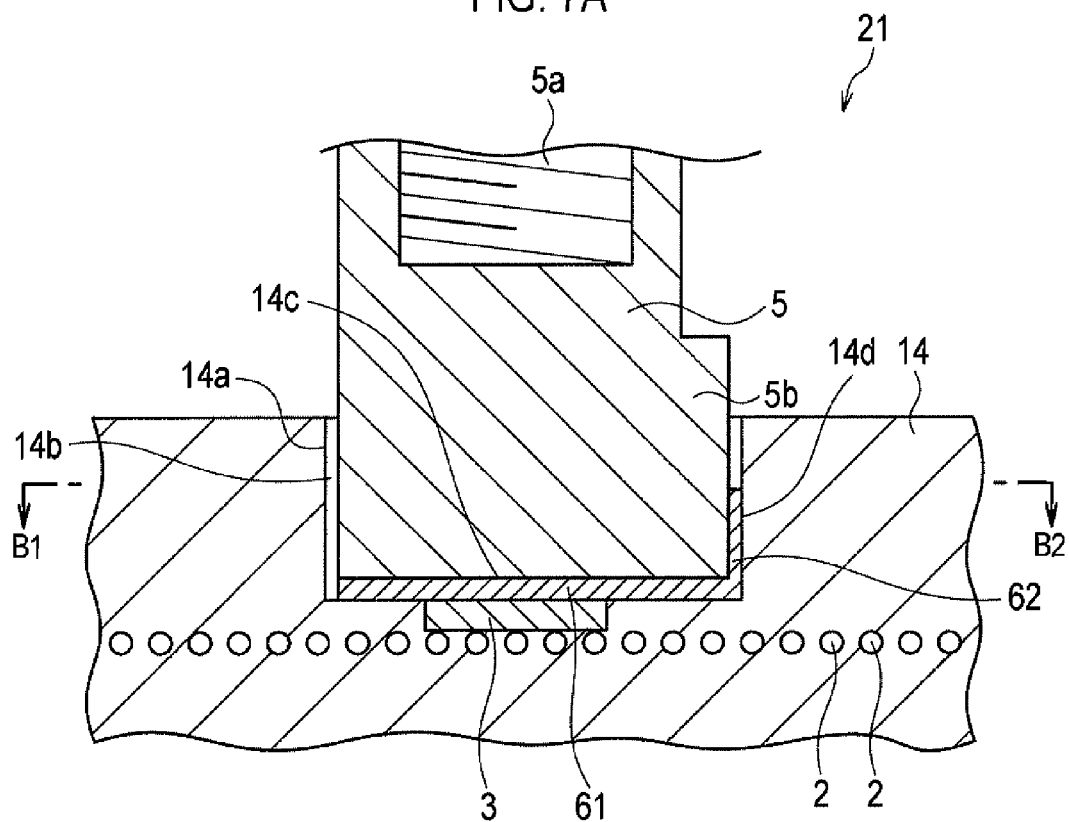
FIG. 7A is a schematic, cross-sectional view of a semiconductor wafer susceptor according to the first modified example of the embodiment, which is vertical to the main surface of the ceramic member included in the semiconductor wafer susceptor.
Figure 7B:
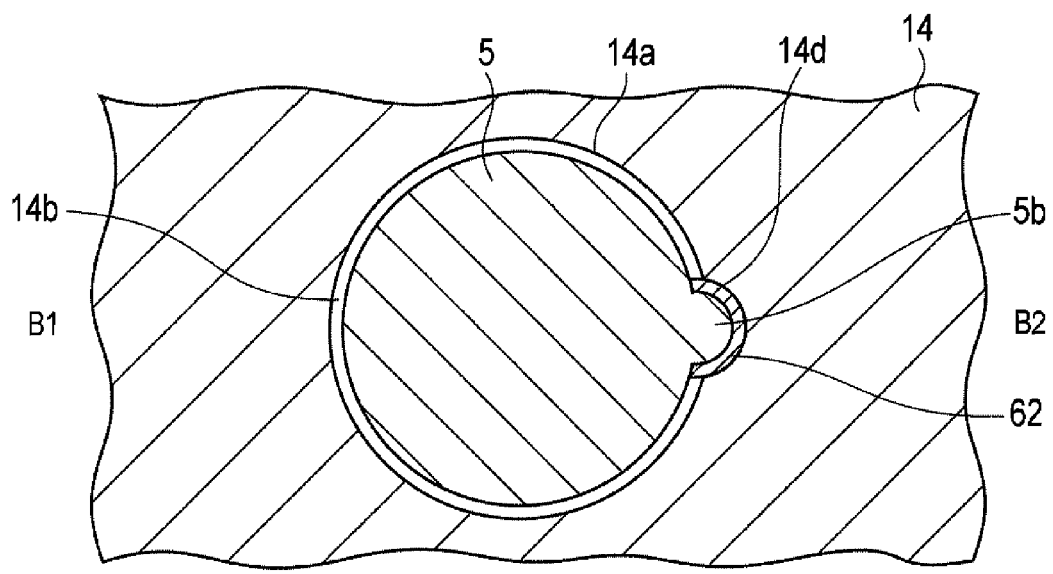
FIG. 7B is a schematic, cross-sectional view of the semiconductor wafer susceptor according to the first modified example of the embodiment, which is parallel with the main surface of the ceramic member.

A semiconductor wafer susceptor may be configured as follows: A braze pool space 14d is formed in a part of the surface of the hole 14a in the ceramic member 14, as shown in FIG. 7B. The braze pool space 14d has a substantially semicircular shape in a cross-sectional plane parallel with its main surface of the ceramic member 14. A protruded portion 5b having a substantially semicircular shape in the cross-sectional plane of the connecting member 5 is formed in a part of a circumferential surface of the connecting member 5 so as to fill a part of the braze pool space 14d. In addition, the part of the braze pool space 14d may be filled with a braze material 62 formed by extending from the first space 14c. The protruded portion 5b fits with the braze pool space 14d and forms a locking portion.

In the case of the semiconductor wafer susceptor (bonding structure) shown in FIG. 7, an oxidation treatment is applied to the side surface of the connecting member 5 except for the surface of a protruded portion 5b. Thereby, the wettability of the braze material is reduced. Consequently, the braze material does not fill the side surface of the connecting member 5 except for the surface of the protruded portion 5b.

Second Modified Example

Figure 8A:
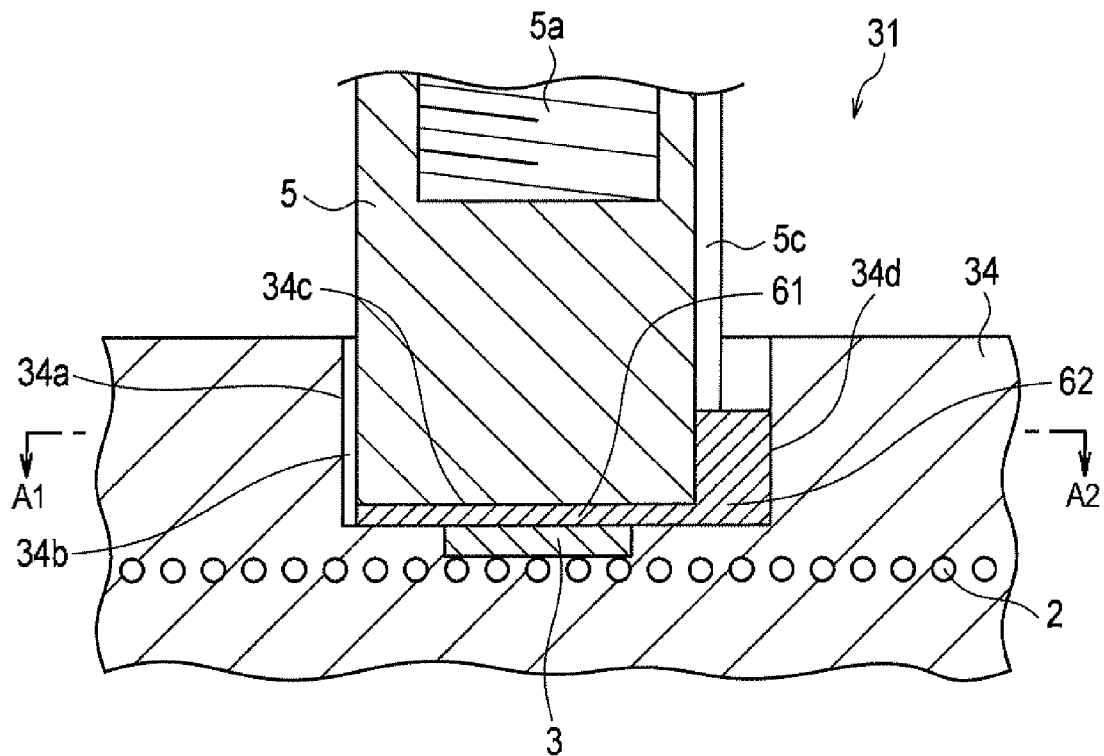
FIG. 8A is a schematic, cross-sectional view of a semiconductor wafer susceptor according to the second modified example of the embodiment, which is vertical to the main surface of the ceramic member included in the semiconductor wafer susceptor.
Figure 8B:
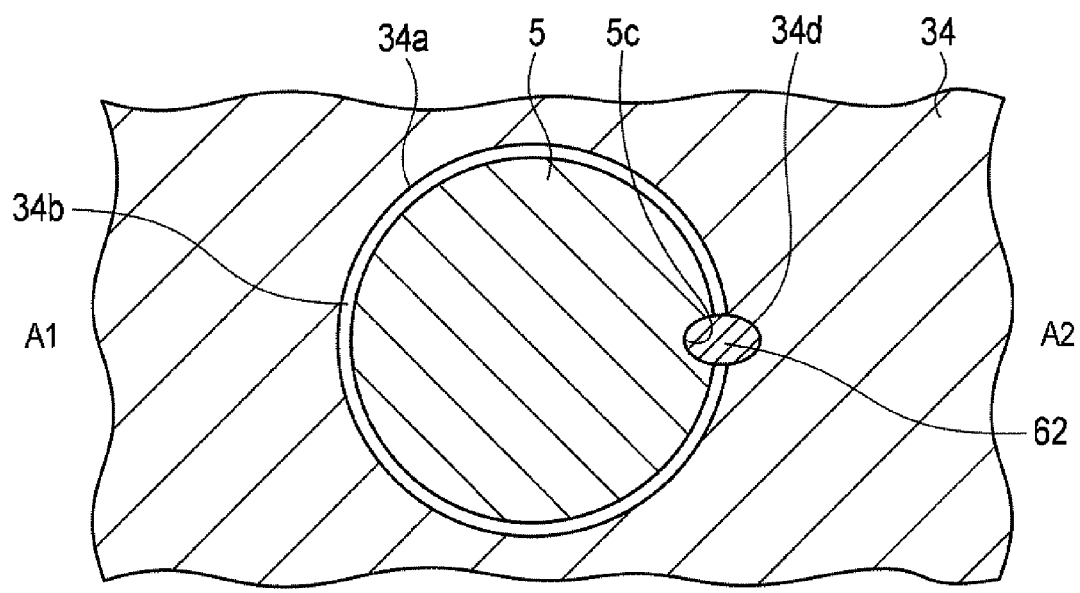
FIG. 8B is a schematic, cross-sectional view of the semiconductor wafer susceptor according to the second modified example of the embodiment, which is parallel with the main surface of the ceramic member.

As shown in FIGS. 8A and 8B, a semiconductor wafer susceptor may be configured as follows: The connecting member 5 has a recessed portion 5c recessing inwardly from a part of the circumferential surface of the connecting member 5. The recessed portion 5c is partially filled with the braze material 62 that is formed by extending from the first space 34c when the connecting member 5 is inserted in the ceramic member 34.

Third Modified Example

Figure 9A:
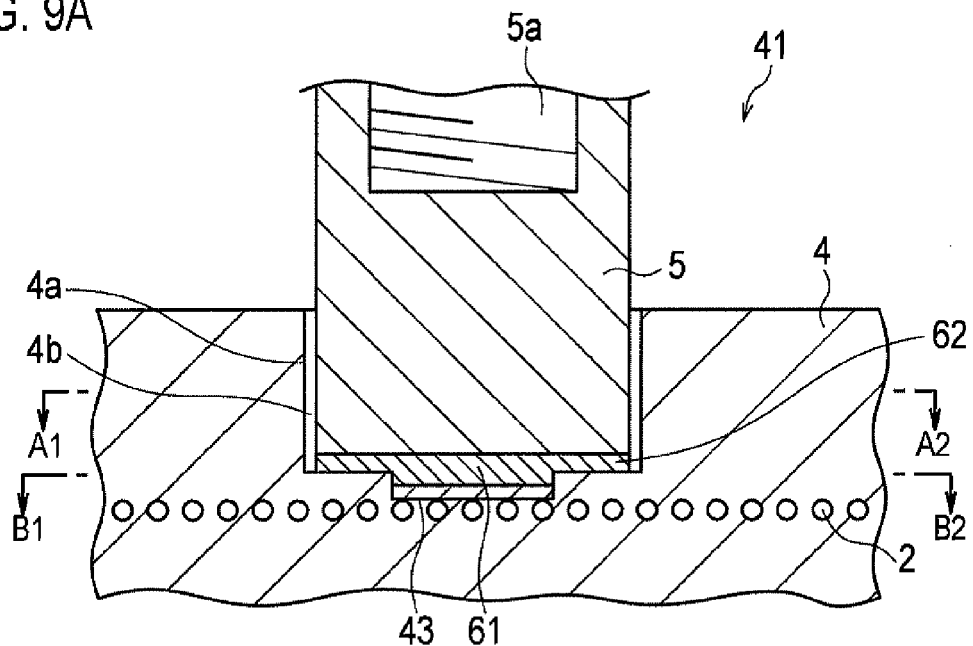
FIG. 9A is a schematic, cross-sectional view of a semiconductor wafer susceptor according to third modified example of the embodiment, which is vertical to the main surface of the ceramic member included in the semiconductor wafer susceptor.
Figure 9B:
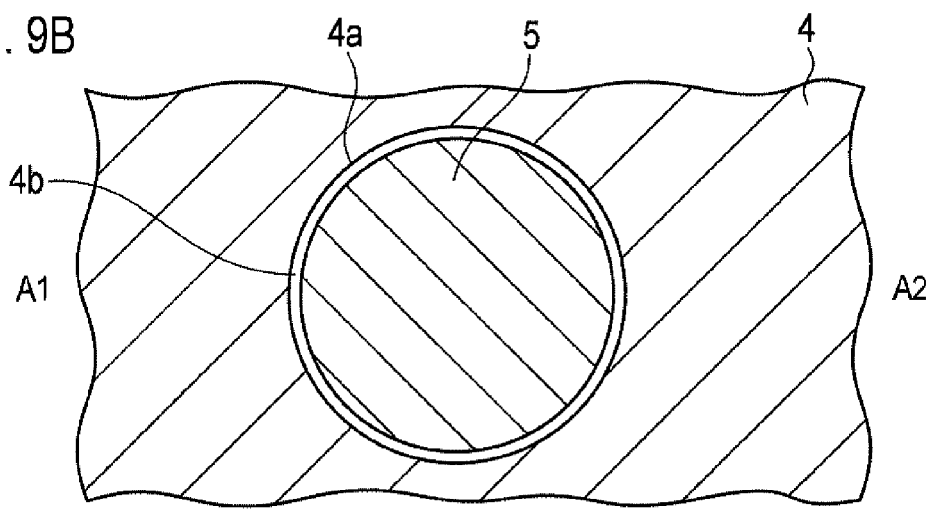
FIG. 9B is a schematic, A1-A2 cross-sectional view of the semiconductor wafer susceptor according to the third modified example of the embodiment, which is parallel with the main surface of the ceramic member.
Figure 9C:
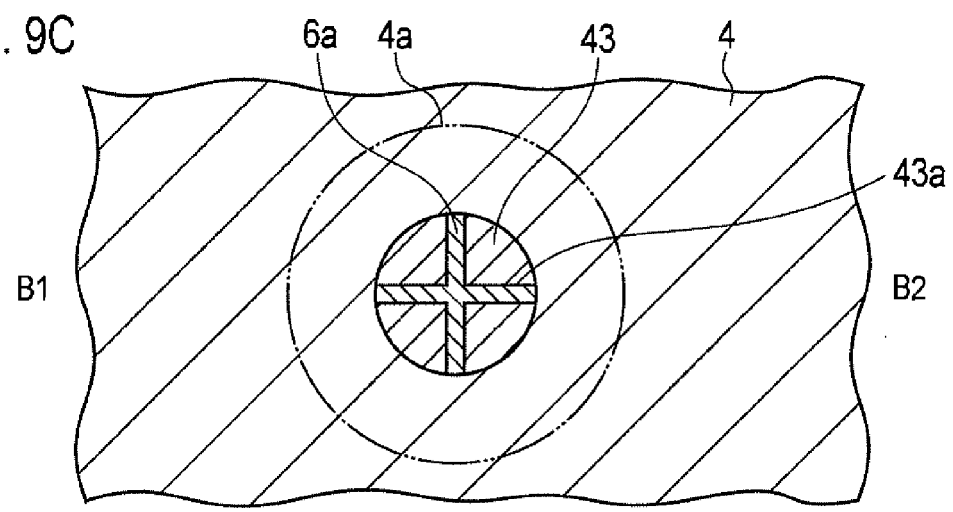
FIG. 9C is a schematic, B1-B2 cross-sectional view of the semiconductor wafer susceptor according to the third modified example of the embodiment, which is parallel with the main surface of the ceramic member.

As shown in FIG. 9C, a semiconductor wafer susceptor may be configured as follows: A groove 43a may be formed on the first main surface of a terminal 43 so as to be formed into a cross. The braze material fills the groove 43a and serves as an anchor. Accordingly, an anchor effect can be achieved, and thereby the torsional breaking strength is enhanced.

In addition, the present invention also provides a semiconductor device manufacturing apparatus including the susceptor (bonding structure) described in the embodiment, causing a semiconductor substrate to be mounted on the susceptor (bonding structure), and applying various treatments to the semiconductor substrate. It goes without saying that the present invention includes other various embodiments and the like which have not been described herein. For this reason, the technical scope of the present invention shall be defined by only invention defining matters concerning the scope of claims which is determined as being appropriate on the basis of the foregoing description.

EXAMPLES

Torsional Breakage Test

In accordance with the descriptions provided for the embodiment, semiconductor wafer susceptors respectively shown in FIGS. 1A, 1B and 7A to 11B were produced with conditions shown in Table 1. Subsequently, for each semiconductor wafer susceptor, a torque applied to the connecting member 5 was increased by 0.1 N·m each time the connecting member 5 was twisted with a torque wrench. Thereby, a torque which each semiconductor wafer susceptor withstood immediately before breakage of the semiconductor wafer susceptor was measured. Thereafter, each semiconductor wafer susceptor was alternately heated at 200° C. and at 700° C. for 100 cycles. After that, similarly, a torque which each semiconductor wafer susceptor withstood immediately before breakage of the semiconductor wafer susceptor was measured. Results obtained from this test are shown in the Table below.

TABLE 1

| | | REFERENCE EXAMPLE 1 | REFERENCE EXAMPLE 2 | EXAMPLE 1 | EXAMPLE 2 | EXAMPLE 3 | EXAMPLE 4 |
|---|---|---|---|---|---|---|---|
| CONDITIONS | REFERENCE DRAWING | 10 | 11 | 1 | 7 | 8 | 9 |
| | CONNECTING MEMBER/BRAZED BOND LAYER/TERMINAL | Mo/Au—Ni/Ni | Mo/Au/Mo | Mo/Au/Mo | Mo/Au/Mo | Mo/Au/Mo | Mo/Au/Mo |
| | CLEARANCE | ABSENT | PRESENT | PRESENT | PRESENT | PRESENT | PRESENT |
| | BRAZE POOL SPACE | ABSENT | ABSENT | PRESENT | PRESENT | PRESENT | ABSENT |
| | LOCKING PORTION | ABSENT | ABSENT | ABSENT | PRESENT | ABSENT | ABSENT |
| | RECESSED PORTION | ABSENT | ABSENT | ABSENT | ABSENT | PRESENT | ABSENT |
| | ANCHOR | ABSENT | ABSENT | ABSENT | ABSENT | ABSENT | PRESENT |
| TORQUE AT TORSIONAL BREAKAGE [N·M] | AFTER BONDING | 1.6 | 2.0 | 3.8 | 4.5 | 4.2 | 3.4 |
| | AFTER DURABILITY TEST | 0.2 | 1.8 | 3.8 | 4.4 | 4.1 | 3.4 |
| | REMARKS | DURABILITY TEST: ALTERNATELY HEATED AT 200° C. AND 700° C. FOR 100 CYCLES | | | | | |

It is learned from reference examples 1 and 2 that the torsional breaking torque is enhanced to some extent when the clearance is formed. In reference example 1, the torsional breaking torque was considerably deteriorated, and the ceramics were cracked because no clearance was formed. Meanwhile, from examples 1 to 4, it is learned that providing the braze pool space and the anchor in addition to the clearance produces the locking effect and the anchor effect, which contributes to remarkable enhancement of the torsional breaking torque. The torsional breaking torque was not deteriorated after the durability test. Moreover, from examples 2 and 3, it is learned that the torsional breaking torque is further enhanced when the locking portion and the recessed portion were formed in addition to the braze pool space.

What is claimed is:

1. A bonding structure comprising:
   a ceramic member including a hole;
   a terminal embedded in the ceramic member, including an exposed surface exposed to a bottom surface of the hole, and made of a refractory metal having a thermal expansion coefficient substantially equal to a thermal expansion coefficient of the ceramic member;
   a brazed bond layer in contact with the exposed surface of the terminal; and
   a connecting member inserted in the hole, bonded to the terminal via the brazed bond layer, and made of a refractory metal having a thermal expansion coefficient substantially equal to the thermal expansion coefficient of the ceramic member; wherein
   an inner diameter of the hole is larger than an outer diameter of the connecting member,
   a clearance between a side surface of the hole and the connecting member when the connecting member is inserted in the hole,
   a braze pool space is formed in the ceramic member in a part of the side surface of the hole,
   the braze pool space has a substantially semicircular shape in a cross-sectional plane parallel with a main surface of the ceramic member, and
   the braze pool space is partially filled with a braze material to lock the connecting member to the ceramic member.

2. The bonding structure according to claim 1, wherein the connecting member includes a protruded portion having a substantially semicircular shape in the cross-sectional plane, and the braze pool space and the protruded portion define a locking portion.

3. The bonding structure according to claim 1, wherein the connecting member includes a recessed portion on a circumferential surface of the connecting member, and the recessed portion is partially filled with a braze material.

4. The bonding structure according to claim 1, wherein a groove filled with a braze material is on the exposed surface of the terminal, and the braze material filling the groove serves as an anchor.

5. The bonding structure according to claim 1, wherein the number of braze pool spaces in the surface of the hole is two to four.

6. The bonding structure according to claim 5, wherein one pair or two pairs of the braze pool spaces are at a mutually-opposed location in the surface of the hole.

7. A semiconductor device manufacturing apparatus comprising the bonding structure according to claim 1, wherein the ceramic member is made of aluminum nitride, and the refractory metal having the thermal expansion coefficient substantially equal to the thermal expansion coefficient of the ceramic member is molybdenum.

* * * * *